United States Patent [19]

Chou

[11] Patent Number: 5,402,432
[45] Date of Patent: Mar. 28, 1995

[54] SEMI-CONDUCTOR LASER DEVICE CONSTANT POWER OUTPUT CONTROLLER

[75] Inventor: Chia-Li Chou, Taipei, Taiwan, Prov. of China

[73] Assignee: Quarton, Inc., Taipei, Taiwan, Prov. of China

[21] Appl. No.: 69,807

[22] Filed: Jun. 1, 1993

[51] Int. Cl.⁶ ............................................. H01S 3/133
[52] U.S. Cl. ......................................... 372/31; 372/38
[58] Field of Search ................................... 372/38, 31

[56] References Cited

U.S. PATENT DOCUMENTS

| | | | |
|---|---|---|---|
| 4,674,093 | 6/1987 | Angerstein et al. | 372/38 |
| 5,179,565 | 1/1993 | Tsuchiya et al. | 372/38 |
| 5,182,756 | 1/1993 | Waki et al. | 372/38 |
| 5,199,039 | 3/1993 | Raper | 372/38 |

*Primary Examiner*—Rodney B. Bovernick
*Assistant Examiner*—Robert McNutt
*Attorney, Agent, or Firm*—Lowe, Price, LeBlanc & Becker

[57] ABSTRACT

A semi-conductor laser device constant power output controller including a power input, a laser diode device consisted of a laser diode and a photoelectric diode, a current driver consisted of a first transistor and a second transistor, and an output control consisted of a zener diode and a variable resistor, whereby the electric current to the laser diode is controlled by the second transistor; the electric current to the second transistor is controlled by the first transistor; the photoelectric diode detects the laser beam of the laser diode for feedback reference; the zener diode and the variable resistor control the output power by means of controlling the electric current to the laser diode.

1 Claim, 2 Drawing Sheets

SEMI-CONDUCTOR LASER DEVICE CONSTANT POWER OUTPUT CONTROLLER

BACKGROUND OF THE INVENTION

The present invention relates to a control device for controlling the constant power output of a semi-conductor laser device.

A variety of laser diodes are manufactured and widely used in a variety of fields. Because different laser diodes have different properties and functions, the problems of over power and less power may occur in an electric circuit consisted of a laser diode. These problems must be eliminated so that the output power of the laser diode can be maintained within a constant range and, the service life of the expensive laser diode can be extended.

SUMMARY OF THE INVENTION

The present invention has been accomplished under the aforesaid circumstances. According to the preferred embodiment of the present invention, the semi-conductor laser device constant power output controller is consisted of a power input, a laser diode, a current driver, an output control. The current driver comprises a first transistor and a second transistor. The electric current to the laser diode is controlled by the second transistor. The first transistor provides a direct electric current to the second transistor. The output control is consisted of a zener diode and a variable resistor and used to control the electric current inputted to the laser diode so as to control the output power. By means of the regulation of the variable resistor, the power output of the laser diode is maintained at a constant range and will not be affected by the change of input voltage. Therefore, the problem of over power or less power is eliminated.

DETAILED DESCRIPTION OF THE PREFERRED EMBODIMENT

Figure 1:
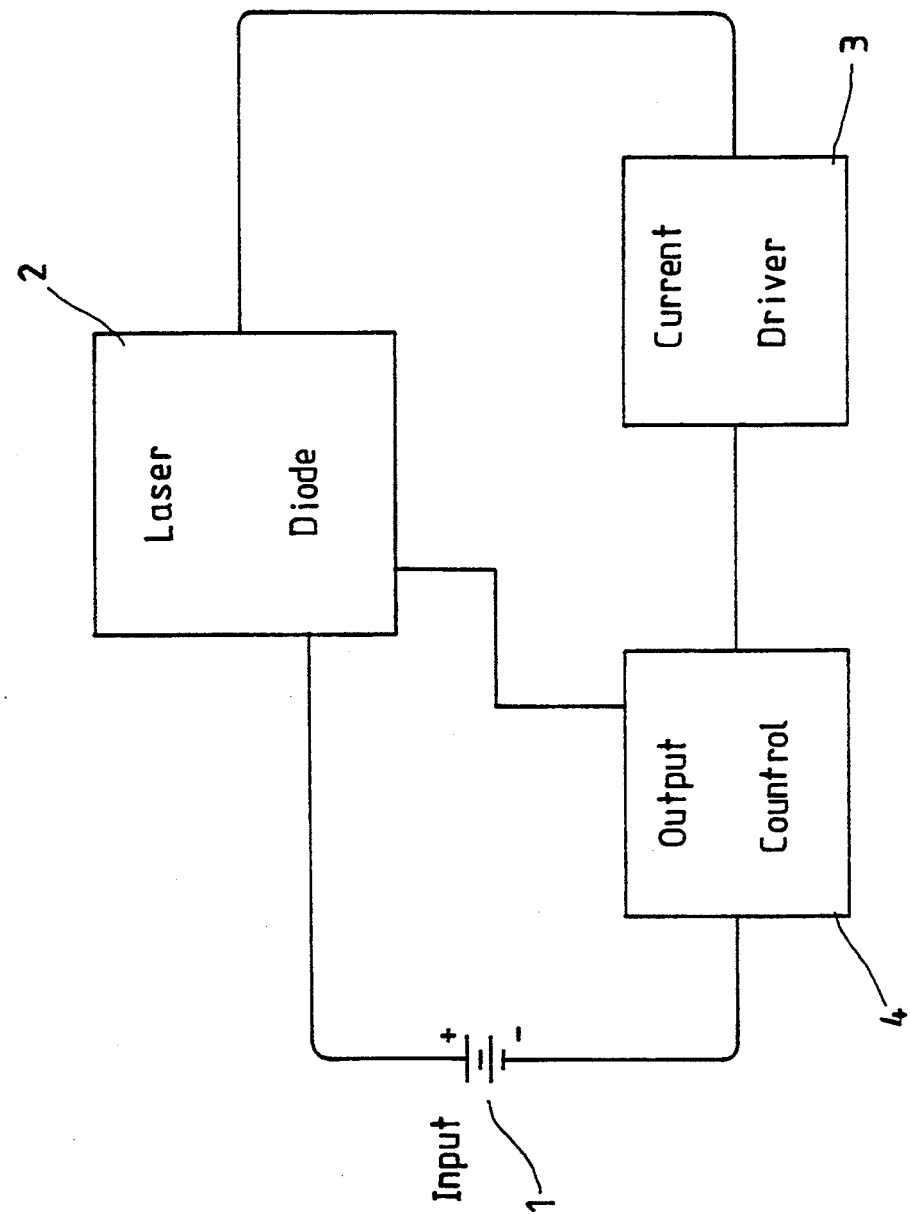
FIG. 1 is a circuit block diagram of the present invention.
Figure 2:
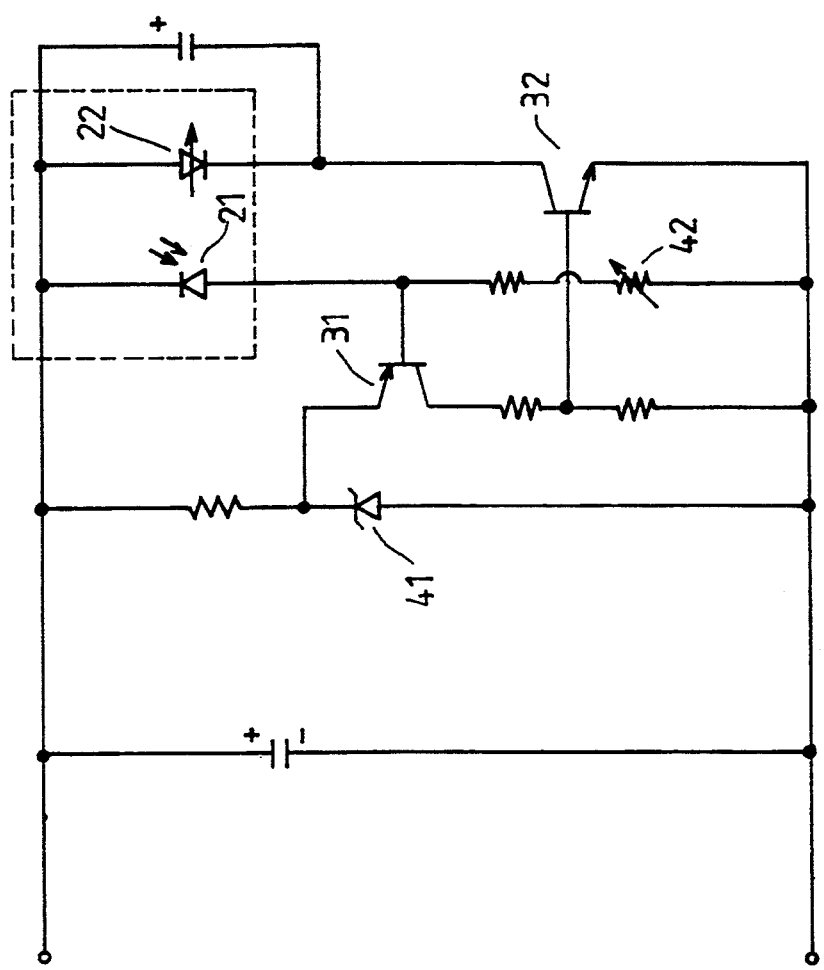
FIG. 2 is a circuit diagram of the present invention.

Referring to FIGS. 1 and 2, a semi-conductor laser device constant power output controller in accordance with the present invention is generally comprised of a power input 1, a laser diode device 2, a current driver 3, and a power output control 4.

The laser diode device 2 is consisted of a laser diode 22 and a photoelectric diode 21. The laser diode 22 is controlled to emit a laser beam. The photoelectric diode 21 receives the laser beam from the laser diode 22 and then provides a feedback to the current driver 3. The current driver 3 comprises a first transistor 31, and a second transistor 32. The first transistor 31 provides a direct electric current to the second transistor 32. The second transistor 32 controls the electric current passing through the laser diode 22. The photoelectric diode 21 is connected to the base of the first transistor 31 and controlled to provide the first transistor 31 with a feedback reference signal according to the laser beam of the laser diode 21. The output control 4 comprises a zener diode 41 and a variable resistor 42 for controlling the electric current passing through the laser diode device 2. The variable resistor 42 is used to regulate the output power of the laser diode device 2. For example, the output power of the laser diode 22 is controlled under 1 mW or 5 mW so as to prevent the laser diode 22 from being damaged.

The output power of a laser diode device may be caused to change by either of two reasons. One reason is that the input working voltage is changed. This problem is eliminated by the zener diode 41 of the present invention, which keeps the electric current free from the change of the input working voltage. The other reason is that the change of the working temperature of the laser diode causes the laser diode to change its power output. This problem is also eliminated by the present invention because the photoelectric diode detects the power output of the laser diode and then provides a feedback signal for compensation. Therefore, the present invention maintains the power output of the laser diode device within a constant range.

While only one embodiment of the present invention has been shown and described, it will be understood that various modifications and changes could be made without departing from the spirit and scope of the invention.

What is claimed is:

1. A semi-conductor laser device constant power output controller comprising a power input, a laser diode device including a laser diode and a photoelectric diode, said laser diode being to produce a laser beam, said photoelectric diode being to detect the laser beam of said laser diode for feedback reference, a current driver including a first transistor and a second transistor, said first transistor providing a direct electric current to said second transistor, said second transistor controlling the electric current passing through said laser diode, and an output control including a zener diode and a variable resistor, wherein said zener diode and said variable resistor control the electric current to said laser diode so as to control a constant output power; said photoelectric diode is connected to the base of said first transistor to provide it with a feedback signal for compensating the electric current to said laser diode; said zener diode keeps the electric current free from the change of the input working voltage being supplied from said power input.

* * * * *